US010365857B2

(12) United States Patent
Ishiyama

(10) Patent No.: US 10,365,857 B2
(45) Date of Patent: Jul. 30, 2019

(54) MEMORY SYSTEM

(71) Applicant: Toshiba Memory Corporation, Tokyo (JP)

(72) Inventor: Masahiro Ishiyama, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 131 days.

(21) Appl. No.: 15/694,976

(22) Filed: Sep. 4, 2017

(65) Prior Publication Data

US 2018/0121136 A1 May 3, 2018

(30) Foreign Application Priority Data

Oct. 27, 2016 (JP) .................. 2016-210524

(51) Int. Cl.
*G06F 12/00* (2006.01)
*G06F 3/06* (2006.01)
*G11C 8/12* (2006.01)
*G11C 16/04* (2006.01)
*G11C 16/10* (2006.01)

(52) U.S. Cl.
CPC .......... *G06F 3/0659* (2013.01); *G06F 3/0604* (2013.01); *G06F 3/064* (2013.01); *G06F 3/0679* (2013.01); *G11C 8/12* (2013.01); *G11C 16/0483* (2013.01); *G11C 16/10* (2013.01)

(58) Field of Classification Search
None
See application file for complete search history.

(56) References Cited

U.S. PATENT DOCUMENTS

| 9,280,466 B2 | 3/2016 | Kunimatsu et al. |
| 9,323,657 B1* | 4/2016 | Sela ................... G06F 11/0793 |
| 9,430,373 B2 | 8/2016 | Larson et al. |
| 9,753,653 B2* | 9/2017 | Ellis ..................... G06F 3/0611 |
| 2006/0129755 A1* | 6/2006 | Raghuram ............... G11C 5/04 711/105 |
| 2011/0194326 A1* | 8/2011 | Nakanishi ................ G11C 5/02 365/51 |
| 2014/0101379 A1 | 4/2014 | Tomlin |

(Continued)

FOREIGN PATENT DOCUMENTS

| JP | 2011022933 A | 2/2011 |
| JP | 2014513356 A | 5/2014 |

OTHER PUBLICATIONS

Matais, "Open-Channel Solid State Drives NVMe Specification", Revision 1.2, Apr. 2016 <http://lightnvm.io/docs/Open-ChannelSSDInterfaceSpecification12-final.pdf>.

*Primary Examiner* — John A Lane
(74) *Attorney, Agent, or Firm* — Kim & Stewart LLP

(57) ABSTRACT

A memory system capable of being connected to a host, includes a non-volatile memory that includes a plurality of non-volatile memory dies, and a controller that is electrically connected to the non-volatile memory. The controller is configured to manage the plurality of non-volatile memory dies as a plurality of die sets, each die set including two or more of the non-volatile memory dies to which priorities are assigned respectively, select one die set from the plurality of die sets based on an identifier received from the host, and select, based on the assigned priorities, a non-volatile memory die from the selected die set as a writing destination die of write data received from the host.

20 Claims, 17 Drawing Sheets

(56) References Cited

U.S. PATENT DOCUMENTS

| | | | |
|---|---|---|---|
| 2015/0234756 A1* | 8/2015 | Tuers | G06F 13/18 710/308 |
| 2016/0093379 A1* | 3/2016 | Siciliani | G11C 11/5621 365/185.12 |
| 2016/0202910 A1* | 7/2016 | Ravimohan | G06F 12/0246 711/103 |
| 2016/0306553 A1* | 10/2016 | Ellis | G06F 3/0611 |
| 2017/0123666 A1* | 5/2017 | Sinclair | G06F 3/0604 |

* cited by examiner

FIG. 3

PROGRAM-ERASE CYCLES (p/e Cycles) TABLE ⎯33A

| Die | Program-erase cycles |
|---|---|
| #0 | |
| #1 | |
| #2 | |
| #3 | |
| #4 | |
| ⋮ | |
| #n | |

| |
|---|
| NAND STRUCTURE INFORMATION |
| BLOCK SIZE (CAPACITY) |
| SSD CAPACITY (USER CAPACITY) |
| OTHERS |

FIG. 5

PRIORITY TABLE 33C

| Base color | PRIORITY OF DIE | | |
|---|---|---|---|
| 0 | #0 | #1 | #2 |
| 1 | #1 | #2 | #0 |
| 2 | #2 | #0 | #1 |

FIG. 6

EXECUTION QUEUE STATE TABLE 33D

| Die | EXECUTION QUEUE STATE (NUMBER OF REMAINING UNCOMPLETED PROCESSES) |
|---|---|
| #0 | 1 |
| #1 | 3 |
| #2 | 2 |
| #3 | 2 |
| #4 | 0 |
| ⋮ | ⋮ |
| #n | 0 |

FIG. 7

| LBA | 0 | 1 | 2 | 3 | 4 | 5 | 6 | 7 | 8 | 9 | 10 | 11 | 12 | 13 | 14 | 15 | 16 | ... |
|---|---|---|---|---|---|---|---|---|---|---|---|---|---|---|---|---|---|---|
| Color | 0 | 0 | 1 | 1 | 2 | 2 | 3 | 3 | 0 | 0 | 1 | 1 | 2 | 2 | 3 | 3 | 0 | ... |

FIG. 9

WRITE COMMAND

| PARAMETER | DESCRIPTION |
|---|---|
| START LBA | INITIAL LBA OF DATA TO BE WRITTEN |
| DATA LENGTH (NUMBER OF LOGICAL BLOCKS) | LENGTH OF DATA TO BE WRITTEN (NUMBER OF LOGICAL BLOCKS CORRESPONDING TO DATA TO BE WRITTEN) |
| Color | IDENTIFIER FOR DESIGNATING WRITING DESTINATION Die (LOGICAL WRITING DESTINATION Die). ANY INTEGER MAY BE USED AS IDENTIFIER |
| Policy (OPTIONAL) | 00: GIVING PREFERENCE TO Die POSITION<br>01: GIVING PREFERENCE TO WRITING SPEED<br>10: GIVING PREFERENCE TO Wear leveling |

FIG. 11

Color MANAGEMENT COMMAND

| PARAMETER | DESCRIPTION |
|---|---|
| LBA RANGE #1 | LBA RANGE TO WHICH SAME Color IS TO BE APPLIED |
| Color#1 | Color APPLIED TO LBA RANGE #1 |
| Policy #1 (OPTIONAL) | Policy APPLIED TO LBA RANGE #1 |
| LBA RANGE #2 | LBA RANGE TO WHICH SAME Color IS TO BE APPLIED |
| Color#2 | Color APPLIED TO LBA RANGE #2 |
| Policy #2 (OPTIONAL) | Policy APPLIED TO LBA RANGE #2 |
| ⋮ | ⋮ |
| LBA RANGE #n | LBA RANGE TO WHICH SAME Color IS TO BE APPLIED |
| Color#n | Color APPLIED TO LBA RANGE #n |
| Policy#n | Policy APPLIED TO LBA RANGE #n |

FIG. 12

Color TABLE    33E

| | LBA RANGE | Color | Policy |
|---|---|---|---|
| ENTRY #1 | LBA RANGE #1 | Color#1 | Policy#1 |
| ENTRY #2 | LBA RANGE #2 | Color#2 | Policy#2 |
| ⋮ | ⋮ | ⋮ | ⋮ |
| ENTRY #n | LBA RANGE #n | Color#n | Policy#n |

FIG. 14

PRIORITY TABLE — 33C

| Base color | PRIORITY OF Die | | | | | | | |
|---|---|---|---|---|---|---|---|---|
| 0 | #0 | #3 | #6 | #1 | #4 | #7 | #2 | #5 |
| 1 | #1 | #4 | #7 | #2 | #5 | #0 | #3 | #6 |
| 2 | #2 | #5 | #0 | #3 | #6 | #1 | #4 | #7 |
| 3 | #3 | #6 | #1 | #4 | #7 | #2 | #5 | #0 |
| 4 | #4 | #7 | #2 | #5 | #0 | #3 | #6 | #1 |
| 5 | #5 | #0 | #3 | #6 | #1 | #4 | #7 | #2 |
| 6 | #6 | #1 | #4 | #7 | #2 | #5 | #0 | #3 |
| 7 | #7 | #2 | #5 | #0 | #3 | #6 | #1 | #4 |

HIGH ←——— PRIORITY ———→ LOW

FIG. 15

PROGRAM-ERASE CYCLES (p/e Cycles) TABLE — 33A

| Die | Program-erase cycles |
|---|---|
| #0 | 952 |
| #1 | 963 |
| #2 | 1031 |
| #3 | 1012 |
| #4 | 1041 |
| #5 | 993 |
| #6 | 963 |
| #7 | 1017 |

FIG. 16

EXECUTION QUEUE STATE TABLE  33D

| Die | EXECUTION QUEUE STATE | | |
|---|---|---|---|
| #0 | | | |
| #1 | R | | |
| #2 | R | R | |
| #3 | W | R | |
| #4 | | | |
| #5 | W | | |
| #6 | E | | |
| #7 | W | E | |

FIG. 17

WEIGHTING RESULT TABLE

| Die | Weight | Breakdown |
|---|---|---|
| #3 | 11 | 0+10+1 |
| #6 | 103 | 3+100 |
| #1 | 7 | 6+1 |
| #4 | 9 | 9 |

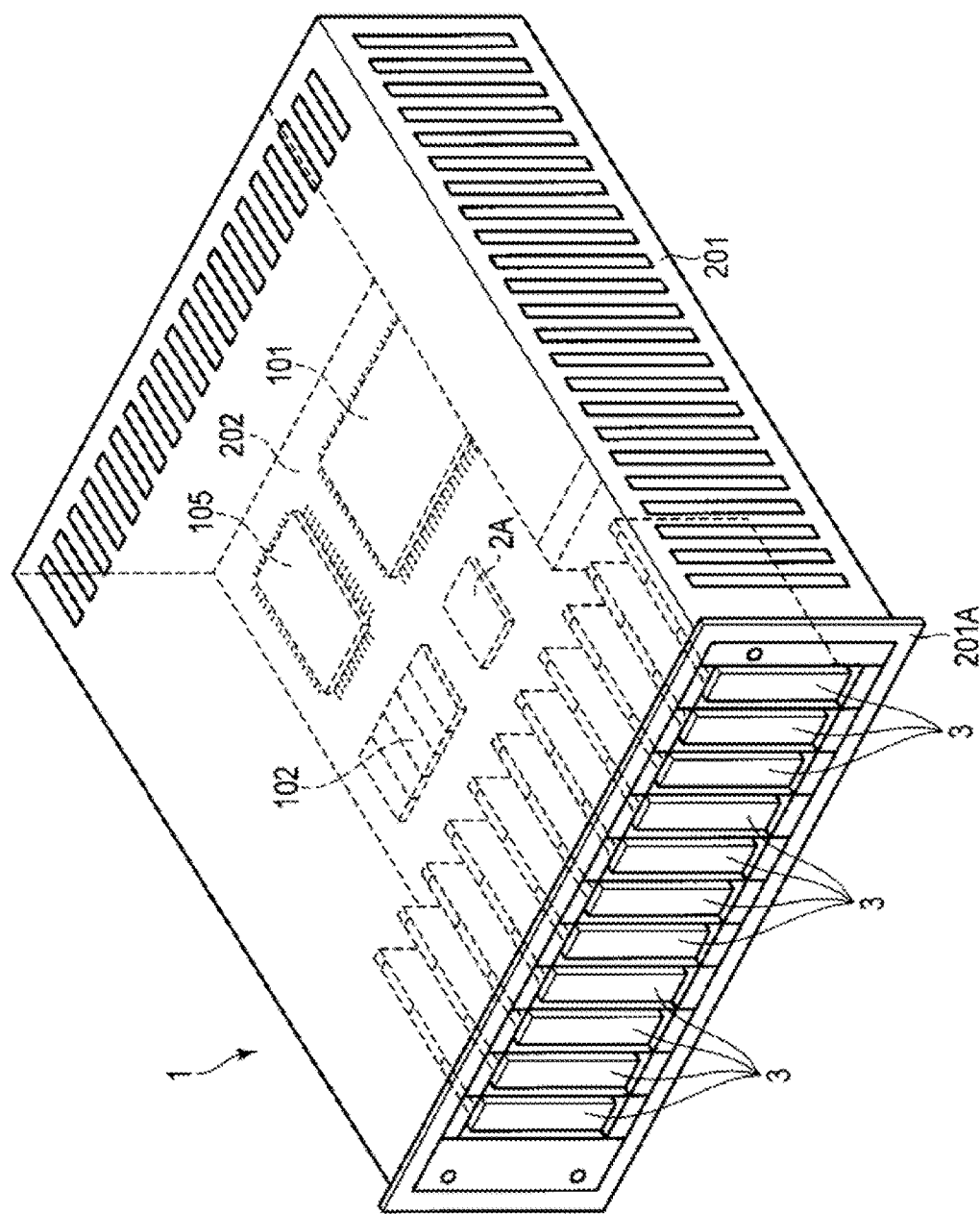

MEMORY SYSTEM

CROSS-REFERENCE TO RELATED APPLICATION

This application is based upon and claims the benefit of priority from Japanese Patent Application No. 2016-210524, filed Oct. 27, 2016, the entire contents of which are incorporated herein by reference.

FIELD

Embodiments described herein relate generally to a memory system including a non-volatile memory.

BACKGROUND

In recent years, memory systems each including a non-volatile memory are widely used.

As one of the memory systems, solid-state drives (SSDs) each including NAND flash memory are known. The SSDs are used as a main storage in various computing devices because of their high performance.

In general, the NAND flash memory mounted in the SSD includes a plurality of NAND flash memory dies (also referred to as NAND flash memory chips). These dies may be operated in parallel.

DESCRIPTION OF THE DRAWINGS

FIG. 3 shows a program-erase cycles (P/E cycles) table managed by a memory system according to the embodiment.

FIG. 4 is a diagram showing NAND structure information managed by the memory system according to the embodiment.

FIG. 5 is a diagram showing a priority table managed by the memory system according to the embodiment.

FIG. 6 is a diagram showing an execution queue state table managed by the memory system according to the embodiment.

FIG. 7 is a diagram showing an example of a correspondence between logical addresses and colors managed by the memory system according to the embodiment.

FIG. 9 shows an example of an expanded write command applied to the memory system according to the embodiment.

FIG. 11 is a diagram showing an example of a color management command applied to the memory system according to the embodiment.

FIG. 12 is a diagram showing a color table generated by the memory system according to the embodiment in accordance with the color management command of FIG. 9.

FIG. 14 is a diagram showing a priority table managed by the memory system according to the embodiment.

FIG. 15 is a diagram showing a program-erase cycles (P/E cycles) table managed by the memory system according to the embodiment.

FIG. 16 is a diagram showing an execution queue state table managed by the memory system according to the embodiment.

FIG. 17 is a diagram showing a weighting result table generated by the memory system according to the embodiment.

FIG. 22 is a diagram showing a configuration example of a computer including the host and the memory system according to the embodiment.

DETAILED DESCRIPTION

In general, according to one embodiment, a memory system capable of being connected to a host, includes a non-volatile memory that includes a plurality of non-volatile memory dies, and a controller that is electrically connected to the non-volatile memory. The controller is configured to manage the plurality of non-volatile memory dies as a plurality of die sets, each die set including two or more of the non-volatile memory dies to which priorities are assigned respectively, select one die set from the plurality of die sets based on an identifier received from the host, and select, based on the assigned priorities, a non-volatile memory die from the selected die set as a writing destination die of write data received from the host.

Hereinafter, embodiments will be described with reference to the drawings. In the embodiments described below, "color" is used to distinguish between different sets of non-volatile memory dies, such that a first set of non-volatile memory dies corresponds to a first color, and a second set of non-volatile memory dies corresponds to a second color.

Figure 1:
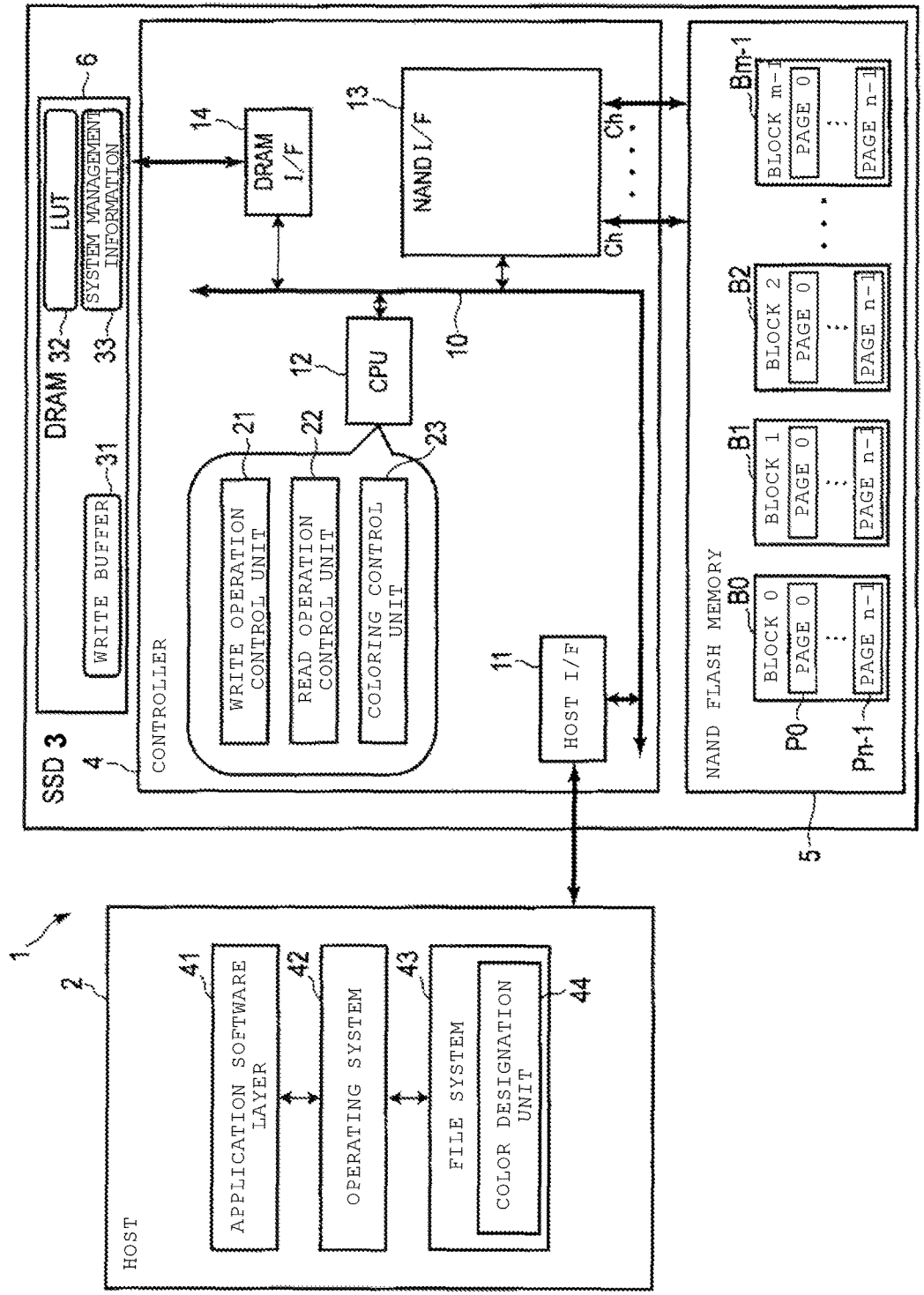
FIG. 1 is a block diagram showing a configuration example of a memory system according to an embodiment.

Initially, a configuration of an information processing system 1 including a memory system according to an embodiment will be described with reference to FIG. 1.

The memory system is a semiconductor storage device that is configured to write data in a non-volatile memory and read data from the non-volatile memory. For example, the memory system is a solid-state drive (SSD) 3 including NAND flash memory.

The information processing system 1 includes a host (host device) 2, and the SSD 3. The host 2 is an information processing device (computing device) that accesses the SSD 3. The host 2 may be a storage server (server) that stores various massive data items in the SSD 3, or may be a personal computer.

The SSD 3 may be used as a main storage of the information processing device functioning as the host 2. The SSD 3 may be built in the information processing device, or may be connected to the information processing device through a cable or a network.

SCSI, Serial Attached SCSI (SAS), ATA, Serial ATA (SATA), PCI Express® (PCIe), Ethernet (registered trademark), Fibre Channel, or NVM Express (NVMe) (registered trademark) may be used as an interface for connecting the host 2 and the SSD 3.

The SSD 3 includes a controller 4, and a non-volatile NAND flash memory 5. The SSD 3 may also include a DRAM 6. The NAND flash memory 5 includes a memory cell array. The memory cell array includes a plurality of blocks B0 to Bm−1. Each of the blocks B0 to Bm−1 represent a unit of erasure. The blocks are also referred to as "erase blocks" or are simply referred to as "physical blocks".

The blocks B0 to Bm−1 each include a plurality of pages. That is, each of the blocks B0 to Bm−1 includes pages P0 to Pn−1. In the NAND flash memory 5, the reading of data and the writing of data are performed on a per page basis. An erasing operation for erasing data is performed on a per block basis.

The controller 4 is electrically connected to the NAND flash memory 5 which is the non-volatile memory through a NAND interface 13 such as Toggle or ONFI.

Figure 2:
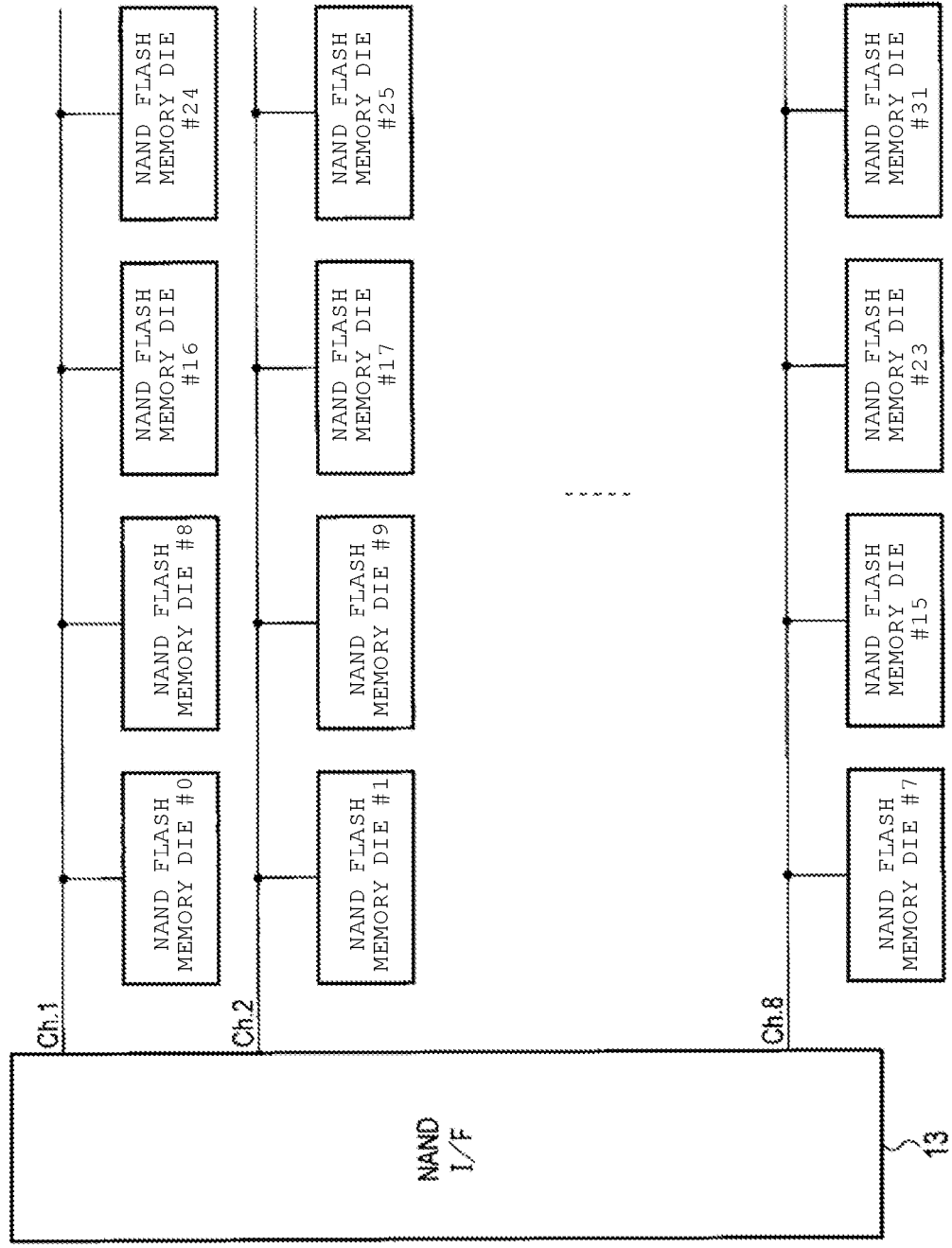
FIG. 2 is a block diagram showing the relationship between a plurality of NAND flash memory dies and a NAND interface within the memory system according to the embodiment.

As shown in FIG. 2, the NAND flash memory 5 includes a plurality of NAND flash memory dies. The die is also referred to as a "chip". Each NAND flash memory die includes a memory cell array including a plurality of memory cells arranged in a matrix configuration. The memory cell array is organized by a plurality of blocks. Each block is organized by a plurality of pages. FIG. 2 shows a case where eight channels (Ch#1 to Ch#8) are connected to the NAND interface 13 and four NAND flash memory dies are connected to each of the eight channels (Ch#1 to Ch#8). Each channel includes a communication line (e.g., memory bus) for communicating with the corresponding NAND flash memory dies. Under the control of the controller 4, the NAND interface 13 may access NAND flash memory dies #0 to #31 through the eight channels (Ch#1 to Ch#8). The number of NAND flash memory dies mounted on the SSD 3 is not limited to 32, and any number of NAND flash memory dies may be mounted on the SSD 3. The number of channels is not limited to eight, and any number of channels may be used.

Incidentally, in recent years, there has been an increasing demand for improving read reply performance in fast storage devices such as an SSD. Particularly, a reply to an access request may be delayed because of tail latency which causes the reply time (also referred to as read latency) to be much longer than an average value of reply times, and also, good predictability of reply times in response to a read request is desired.

One of the causes of a change of the read latency is a collision of accesses to the NAND flash memory die. When the collision occurs, processes (e.g., a write operation, a read operation, and an erasing operation) on the one NAND flash memory die (simply referred to as a die) cannot be performed in parallel, and should be sequentially performed.

In general, it takes a longer time to perform a write operation on the NAND flash memory than a read operation. Accordingly, when a read operation is performed on the die that is performing the write operation, a latency of the reading is considerably longer than usual, and thus, the read latency is changed.

In the NAND flash memory, only the blocks in an erasure state may be written. Thus, an erase process needs to be performed on a block basis before a write operation is initially performed on the block. When the read operation is performed on the die that is performing the erase process, a latency of the reading is considerably longer than usual, and thus, a read latency is changed.

As stated above, hereinafter, a case where a process is requested for the same die is referred to as a die collision.

In the writing of data in the SSD from the host, a storage position in which data is to be written is typically represented by a logical address called logical block address (LBA).

Meanwhile, the allocation of the LBAs to the blocks of the dies is typically managed within the SSD, and thus, the host is not aware of such allocation.

Thus, when the host performs the writing, the host does not specify the die which is performing the write operation. Accordingly, the host is unable to prevent the die collision by specifying a particular die in the request.

As one method for avoiding the die collision, a method for notifying the host of information regarding a configuration of channels and dies within the SSD is considered. If this method is used, the host may designate the channel and the die, as information for designating a storage position in which data is to be written, instead of the typical LBA. Accordingly, since the host may directly designate the die in which the data is to be written, the host can recognize a request that would result in a die collision.

However, this method has a problem of wear leveling.

The wear leveling is a technique for leveling program-erase cycles (P/E cycles) across a plurality of blocks. The NAND flash memory has a limited number of program-erase cycles, and has a property that a particular block is not able to be used if the program-erase cycles of that block exceed an upper limit.

Thus, in order to increase the lifespan of the overall SSD, it is necessary to level the program-erase cycles across blocks in the SSD.

For example, even though a write request for the same LBA is received from the host, the SSD writes data items in different storage positions, and records the relationship between the LBA and the storage position in which the data is actually written. Writing destinations of the data items are selected such that the program-erase cycles between the blocks are leveled as much as possible.

In the SSD to which the above-described method of directly designating a writing destination die from the host is applied, a leveling range is greatly restricted. For example, in the case of the SSD including 64 dies, when the host continues to write the data in the same LBA, it is predicted that program-erase cycles of a certain block will exceed the upper limit with the amount of written data items which is 1/64 of that in a typical SSD.

As stated above, in the above-described method of directly designating the writing destination die from the host, data writing may be concentrated on a certain specific die. In this case, the program-erase cycles (P/E cycles) of the certain specific die may easily reach the upper limit, and thus, the lifespan of the SSD may be shortened. Also, since the number of channels or dies may vary depending on a model of the SSD, a behavior of an application may need changing so as to be appropriate for the model, and thus, the load on application development may increase.

Thus, the SSD 3 according to the present embodiment has a new function (hereinafter, referred to as coloring) to improve the reply performance of the SSD 3 in response to access requests without shortening the lifespan of the SSD 3. Through the coloring, the host 2 does not directly designate the writing destination die, but instead, the SSD receives an identifier indicating a certain logical writing destination die from the host 2, selects any one die set from several die sets based on the received identifier, and determines any one die within the selected die set, as an actual writing destination die.

In each die set, priorities are given to the dies. The SSD 3 selects the die set based on the received identifier, selects one die from the selected die set based on the prioritization of the dies within the selected die set, and determines the selected die as a writing destination die for write data received from the host 2.

Thus, in the coloring function of the present embodiment, it is possible to select a wide writing destination range called the die set based on the identifier received from the host 2, and it is possible to distribute the writing destinations between the dies within the selected die set. In so doing, it is possible to improve the reply performance of the SSD 3 without shortening the lifespan of the SSD 3.

For selecting one writing destination die from the plurality of dies within the die set selected based on the received identifier, any method capable of selecting the writing destination die based on the prioritization of the dies within the selected die set can be used.

For example, the SSD 3 may determine, as the writing destination die, the die which satisfies a condition related to at least one of the wear leveling and the performance and has a higher priority. In this case, the SSD 3 may evaluate the states (for example, the program-erase cycles or the number of remaining uncompleted processes) of the dies within the selected die set in order of the priorities of the dies.

All the dies are the substantially same state for a predetermined period in which the use of the SSD 3 is started. Thus, whenever the writing for the SSD 3 is requested, the die having the highest priority within the selected die set is determined as the writing destination die. Accordingly, the write data from the host is written in the die having the highest priority within the selected die set.

Program-erase cycles of the die having the highest priority within the selected die set gradually increase with the elapse of time. Then, a difference between current minimum program-erase cycles and the program-erase cycles of the die having the highest priority exceeds a certain program-erase cycle allowable difference. In this case, the SSD 3 determines that the program-erase cycles of the die having the highest priority does not satisfy a condition for wear leveling, and changes the writing destination die to a die having the second highest priority within the selected die set.

As mentioned above, in the selected die set, the die to be used as the writing destination die is gradually moved to the die having the lowest priority from the die having the highest priority depending on the program-erase cycles of the dies within the die set. Thus, even when the host 2 performs a write operation which is biased to a specific color, it is possible to level program-erase cycles between dies within a die set corresponding to this color, and thus, it is possible to maintain the lifespan of the SSD 3.

If the host 2 designates different colors, different die sets are selected. Accordingly, as long as the host 2 performs a write operation which is not biased to a specific color, it is possible to decrease a probability that the die collision will occur.

Although it is described in this example that the writing destination die is determined based on the condition related to the wear leveling (e.g., program-erase cycles), the writing destination die may be determined based on another condition related to the performance (e.g., the number of remaining uncompleted processes). Even in this case, it is predicted that the die having the highest priority will be most preferentially determined as the writing destination die for only an initial period. The amount of data items stored in the die having the highest priority increases with the elapse of time, and thus, the number of items of the read operations for the die having the highest priority also increases. Thus, since the number of remaining uncompleted processes in the die having the highest priority gradually increases, the writing destination die is gradually distributed over the dies within the selected die set. Accordingly, even when the condition related to the performance (e.g., the number of remaining uncompleted processes) is used, it is possible to improve the performance of the SSD 3 without shortening the lifespan of the SSD 3 similarly to the case where the condition related to the wear leveling (e.g., program-erase cycles) is used.

Hereinafter, a configuration of the controller 4 of FIG. 1 will be described.

The controller 4 is electrically connected to the plurality of NAND flash memory dies through the plurality of channels (for example, eight channels). The controller 4 may function as a flash translation layer (FTL) configured to perform data management of the NAND flash memory 5 and block management of the NAND flash memory 5.

The data management includes (1) a management of mapping information indicating a correspondence between the logical addresses and the physical addresses of the NAND flash memory 5, and (2) a process for concealing the read and write operations on the page basis and the erasing operation based on the block basis. The logical address is an address used by the host in order to designate the address of the SSD 3. The logical block address (LBA) is typically used as the logical address. In the following description, it is assumed that the logical address is the logical block address (LBA).

The management of the mapping of the logical block addresses (LBAs) and the physical addresses is performed using a lookup table (LUT) 32 functioning as an address conversion table (e.g., logical-to-physical address conversion table). The controller 4 manages the mapping of the LBAs and the physical addresses based on a predetermined management size unit by using the lookup table (LUT) 32. A management size unit is not limited, and may be, for example, 4 kilobytes. The address conversion table (LUT 32) may be loaded into the DRAM 6 from the NAND flash memory 5 when the SSD 3 is powered on.

A physical address corresponding to a certain LBA indicates a physical storage position within the NAND flash memory 5 in which the data of the LBA is written. For example, the physical address may be expressed by a combination of a die number, a block number, and a page number.

The data writing for the page can be performed one time per one erase cycle. Thus, the controller 4 maps the writing for the same LBA (also referring to as overwriting) to different pages on the NAND flash memory 5. That is, the controller 4 writes the data designated by the write command received from the host 2 (i.e., write data) in a page capable of being written within a writing destination block included in the writing destination die irrespective of the LBA of the data. The controller 4 updates the lookup table (LUT) 32, and associates the LBA with the physical address of the physical storage position in which the data is actually to be written. If there is no available page in the writing destination block, a new block is allocated as the writing destination block.

The block management includes the management of bad blocks, the wear leveling, and garbage collection.

The host 2 sends a read request (also referred to as a read command), a write request (also referred to as a write command), and other various requests (or other various commands) to the SSD 3. The read command is a command for requesting that data is to be read from the SSD 3. The read command includes an LBA (in particular, start LBA) of data to be read, and a data length of the data to be read. The write command is a command for requesting that data is to be written in the SSD 3. The write command includes an LBA (in particular, start LBA) of write data (that is, data to be written) and a data length of the write data.

The controller 4 may include a host interface 11, a CPU 12, the NAND interface 13, and a DRAM interface 14. The CPU 12, the NAND interface 13, and the DRAM interface 14 may be connected to each other through a bus 10.

The host interface 11 receives various commands (for example, a write command, a read command, an erase command, and an UNMAP/Trim command) from the host 2.

The CPU 12 is a processor configured to control the host interface 11, the NAND interface 13, and the DRAM interface 14. The CPU 12 loads a control program (e.g., firmware) stored in a ROM (not shown) or the NAND flash memory 5 onto the DRAM 6 in response to the powering-on of the SSD 3, and performs a predetermined process. For example, the CPU 12 performs a command process for processing various commands received from the host 2 in addition to the FTL process. An operation of the CPU 12 is controlled by the firmware executed by the CPU 12. A part or all of the FTL process and the command process may be performed by dedicated hardware within the controller 4.

In the embodiments, the CPU 12, appropriately programmed, functions as a write operation control unit 21, a read operation control unit 22, and a coloring control unit 23.

The write operation control unit 21 receives write data from the host 2 in response to the reception of the write request from the host 2. The write operation control unit 21 writes the write data in the writing destination die within the NAND flash memory 5. The read operation control unit 22 reads data designated by the read command from the NAND flash memory 5 in response to the reception of the read request from the host 2. The read operation control unit 22 transmits the read data to the host 2.

The coloring control unit 23 executes the above-described coloring function.

The coloring control unit 23 manages, as a plurality of die sets, the plurality of NAND flash memory dies within the NAND flash memory 5. Each die set includes several NAND flash memory dies to which the priorities are given. The coloring control unit 23 receives an identifier (e.g., color) for designating a logical writing destination die from the host 2, and selects one die set from the plurality of die sets based on this color. The coloring control unit 23 selects the NAND flash memory die which satisfies the condition related to at least one of the wear leveling and the performance, and which has a higher priority from the selected die set by evaluating the states of the NAND flash memory dies within the selected die set in order of the priorities of the NAND flash memory dies. The coloring control unit 23 determines, as the writing destination die in which the write data received from the host 2 is to be written, the selected NAND flash memory die.

The NAND interface 13 is a NAND controller that controls the NAND flash memory 5. The DRAM interface 14 is a DRAM controller that controls access to the DRAM 6. A storage area of the DRAM 6 is utilized in order to function as a write buffer (WB) 31, and to store a lookup table (LUT) 32 and system management information 33. The system management information 33 includes various management information items required in the coloring function.

Hereinafter, a configuration of the host 2 will be described.

The host 2 is an information processing device that executes various programs. The program executed by the information processing device includes an application software layer 41, an operating system (OS) 42, and a file system 43.

As is generally known, the operating system (OS) 42 is software that is configured to manage the overall host 2, control hardware within the host 2, and control an application to use the hardware and the SSD 3.

The file system 43 is used for controlling operations (creating, storing, updating, and removing) of a file. For example, ZFS, Btrfs, XFS, ext4, and NTFS may be used as the file system 43. Alternatively, a file object system (for example, Ceph Object Storage Daemon), Key Value Store system (for example, Rocks DB) may be used as the file system 43.

Various application software threads are run on the application software layer 41. As examples of the application software thread, there are client software, database software, and a virtual machine.

When it is necessary for the application software layer 41 to send a request such as the read command or the write command to the SSD 3, the application software layer 41 sends the request to the OS 42. The OS 42 sends the request to the file system 43. The file system 43 translates the request to the command (e.g., the read command or the write command). The file system 43 sends the command to the SSD 3. When a reply from the SSD 3 is received, the file system 43 sends the reply to the OS 42. The OS 42 sends the reply to the application software layer 41.

The file system 43 may include a color designation unit 44. The color designation unit 44 is a program module for designating the identifier (e.g., color). The color designation unit 44 allows the file system 43 to issue an expanded write command, which additionally includes a color value as a parameter in order to perform the write operation which is not biased to the specific color. The color designation unit 44 may be incorporated in the operating system 42, or may be incorporated in the application.

FIG. 3 shows a program-erase cycles (p/e cycles) table 33A.

The program-erase cycles table 33A is a part of the system management information 33, and indicates program-erase cycles of NAND flash memory dies #0, #1, #2, . . . , and #n mounted on the SSD 3. The program-erase cycles of each die are the total of program-erase cycles of the plurality of blocks included in this die.

FIG. 4 shows structure information of the NAND flash memory 5.

The structure information of the NAND flash memory 5 is a part of the system management information 33, and includes a block size, and a user area capacity. The block size indicates a size of one block. The user area capacity indicates a portion of the total capacity of the NAND flash memory 5, which is capable of being used by the host 2. The controller 4 may report the structure information to the host 2 in response to a request from the host 2.

FIG. 5 shows a priority table 33C.

The priority table 33C is a part of the system management information 33, and is used for managing the plurality of die sets for the coloring function.

That is, the controller 4 of the SSD 3 manages the NAND flash memory dies mounted on the SSD 3 by using different attributes (e.g., base colors) for coloring. The total number of base colors to be used by the controller 4 is referred to as the number of base colors (NBC). The number of base colors (NBC) indicates the number of die sets to be used for the coloring. The controller 4 assigns continuous integer values starting from 0 to the base colors. The controller 4 determines the writing priority of the die for each base color.

It is preferable that the die having the highest priority is different between the base colors. Accordingly, the number of base colors is typically equal to the total number of dies mounted on the SSD 3. The number of base colors may be less than the total number of dies. The priorities of the dies corresponding to the base colors are determined in advance, and then, the priorities of the dies are not changed. For example, the priority of the die may be determined for each base color before the shipment of the SSD 3.

The priority table 33C of FIG. 5 shows that the total number of dies mounted on the SSD 3 is 3 and the number of base colors is 3. In the priority table 33C, three different dies #0, #1, and #2 are allocated as the dies having the highest priorities to three base colors "0", "1", and "2". For the base color "0", the writing priorities related to the die set corresponding to the base color "0" are determined such that the writing priorities are in the order of the dies #0, #1, and #2. That is, the dies #0, #1, and #2 function as the die set corresponding to the base color "0".

Similarly, for the base color "1", the writing priorities related to the die set corresponding to the base color "1" are determined such that the writing priorities are in the order of the dies #1, #2, and #0. For the base color "2", the writing priorities related to the die set corresponding to the base color "2" are determined such that the writing priorities are in the order of the dies #2, #0, and #1.

Although it is described in the priority table 33C of FIG. 5 that the number of dies included in the die set corresponding to each base color is equal to the total number of dies mounted on the SSD 3 (in this example, 3), the number of dies included in each die set may be less than the total number of dies mounted on the SSD 3.

That is, the priorities are not determined for all the dies included in the SSD 3, and the priorities may be determined for a predetermined number of limited dies for each base color. In this case, when all the dies within the die set corresponding to a selected base color do not satisfy the writing condition, the writing destination die may be selected from another die that is not included in the die set.

The contents of the base colors and the writing priorities of the dies corresponding to the base colors may have a predetermined relationship. For example, the writing priorities of the dies corresponding to adjacent base colors may be determined such that the dies selected as the writing destination dies between the adjacent base colors are statistically hardest to overlap. In this case, when there are two processes for which the least amount of collision is desired, the host 2 assigns two adjacent colors to two processes. Accordingly, it is possible to minimize a probability that die collision will occur. A case of adjacent base colors is satisfied when two different base colors C1 and C2 are given, and C2−C1 is equal to 1 or C2−C1 is equal to the number of base colors−1.

For example, as the color designated by the host 2, any integer may be used. It is assumed that the host 2 designates a color c for a certain write operation of data (color=c), where c may be any integer. Initially, the controller 4 acquires the base color according to the following expression.

base color=color % number of base colors where % is an operation symbol indicating a modulo operation.

That is, the controller 4 calculates the remainder acquired by dividing the color c by the number of base colors, and uses the remainder as the base color. It is assumed that the result of the modulo operation is bc, where bc indicates a value of the base color to be selected.

In so doing, the controller 4 may select one base color from the plurality of base colors based on the color designated by the host 2. The priorities are assigned to the dies corresponding to the selected base color. The controller 4 selects the die which satisfies the condition related to the wear leveling or the performance, and which has higher priority from the selected die set by evaluating the states of the dies within the selected die set in the order of the priorities of the dies.

For example, when the condition related to the wear leveling is used in order to select the die, the controller 4 selects the die which satisfies the condition related to the wear leveling and has a higher priority by evaluating the program-erase cycles of the dies included in the selected die set in the order of the priorities. The die which satisfies the condition related to the wear leveling means a die having program-erase cycles of which a difference from current minimum program-erase cycles is within an allowable difference.

For example, when the condition related to the performance is used in order to select the die, the controller 4 selects the die which has a smaller number of uncompleted processes to have a higher priority from the selected die set by evaluating the number of remaining uncompleted processes assigned to the dies included in the selected die set in the order of the priorities.

When the host 2 transmits the write command to the SSD without designating the color, the controller 4 may automatically give a certain color to the LBA of the writing destination designated by the write command. In this case, the controller 4 may notify the host 2 of the color given to the LBA. Accordingly, the host 2 may recognize the color given to the LBA. The host 2 may query about a color given to a certain LBA to the SSD 3 at any time, and the SSD 3 may notify the host 2 of the color given to the LBA in response thereto.

The host 2 may designate a policy to be applied in order to select the writing destination die in addition to the color. This policy is additional information for designating a condition to be preferentially applied in order to select the die. For example, the policy may indicate any one of "giving preference to die position", "giving preference to writing speed", and "giving preference to wear leveling".

When the policy is designated by the host 2, the controller 4 changes a weighting value added to the evaluation of the number of remaining uncompleted processes or the evaluation of the program-erase cycles of each die.

(1) Giving Preference to Die Position

When the policy indicates "giving preference to die position", the controller 4 may select the die having the highest priority from the selected die set as much as possible. In this example, the term "as much as possible" means that a rule for defining an absolutely unallowable level determined by the SSD is not broken.

For example, it is necessary for all the program-erase cycles to obey a rule that allows a difference between the program-erase cycles and the current minimum program-erase cycles not to be greater than a maximum allowable difference. The current minimum program-erase cycles are a minimum value within the current program-erase cycles of all the dies. In addition, it may be necessary to obey a rule that the number of remaining uncompleted processes is not greater than a maximum allowable number of remaining processes.

(2) Giving Preference to Writing Speed

When the policy indicates "giving preference to writing speed", the controller 4 selects, as the writing destination die, the die in which the requested write operation is completed as early as possible, for example, the die in which the number of remaining uncompleted processes is the smallest in the selected die set.

In this case, as the method for selecting the writing destination die based on the number of remaining uncompleted processes, a method for selecting the writing destination die based on only the number of remaining uncompleted processes may be used, or a method for adding a weight to the number of remaining uncompleted processes based on the contents of the uncompleted processes and selecting the writing destination die based on the weighted number of remaining uncompleted processes may be used. An example of the weight will be described below.

For example, when a weight of the read process is 1, a weight of 10 may be added to the write process, and a weight of 100 may be added to the erase process. It is assumed that a die X of which a priority is first place and in which the number of remaining write processes is 1 and a die Y of which a priority is second place and in which the number of remaining read processes is 9 coexist. The weighting result of the number of remaining uncompleted processes of the die X is 10, and the result acquired by adding the weight to the number of remaining uncompleted processes of the die Y is 9. Accordingly, the die Y is selected.

Weighting for lower priority of the die may also be performed. For example, a weight of 3 may be added when the priority is less by one. It is assumed that a die X of which a priority is first place and in which the number of remaining write processes is one and a die Y of which a priority is second place and in which the number of remaining read processes is nine coexist. The weighting result of the number of remaining uncompleted processes of the die X is 10, and the result acquired by adding the weight to the number of remaining uncompleted processes of the die Y is 12 (=9+3). Accordingly, the die X is selected.

(3) Giving Preference to Wear Leveling

When the policy indicates "giving preference to wear leveling", the controller 4 may select the die in which a difference between program-erase cycles of the selected die and the minimum program-erase cycles is equal to or less than a certain allowable difference and has a higher priority from the selected die set.

For example, (i) a maximum allowable difference from the minimum program-erase cycles and (ii) a preferable allowable difference from the minimum program-erase cycles may be used as the allowable difference.

The maximum allowable difference is typically set to be a value greater than the preferable allowable difference. When the policy indicates "giving preference to wear leveling", the controller 4 may select the die in which a difference between program-erase cycles of the selected die and the minimum program-erase cycles is equal to or less than a certain preferable allowable difference and has a higher priority from the selected die set such that differences between the program-erase cycles of the dies are further leveled.

(4) No Designation of Policy

When the policy is not designated, the controller 4 selects the die by using a default policy corresponding to characteristics considered as being most important by the SSD 3. For example, if the wear leveling is an index considered as being most important, the SSD 3 may select the die in which a difference between program-erase cycles of the selected die and the minimum program-erase cycles is equal to or less than a certain allowable difference (for example, a preferable allowable difference) and has a higher priority.

FIG. 6 shows an execution queue state table 33D.

The execution queue state table 33D is a part of the system management information 33, and is used for determining the writing destination die by the policy of "giving preference to writing speed".

The execution queue state table 33D may indicate the number of remaining uncompleted processes assigned to each die.

Hereinafter, several methods for instructing a color will be described.

(1) Host Explicitly Instructs Color in Writing

The host 2 may designate a color and a policy as follows whenever the write command is transmitted to the SSD 3.

write(addr=x, data=y, color=z, policy=w)

where addr indicates a start logical address (e.g. start LBA) in which data is to be written.

(2) Host Explicitly Instructs Color by Designating Range of Logical Address (e.g. LBA) in Advance In this case, the host 2 transmits a color allocation request including a combination of a logical address range and a color to be applied to the logical address range to the SSD 3 in advance, as is described below.

color_assign(addr=100, len=16, color=z, policy=w)

where addr indicates a start logical address (e.g. start LBA) in which data is to be written, and len indicates a logical address length (the number of logical blocks).

color=z and policy=w will be applied to the writing for which color is not designated, as is described below.

write(addr=101, data=y)⇒color=z, policy=w

Any length may be designated as len, and for example, len corresponding to the block size may be used. In this case, the host 2 may divide a logical address space (LBA space) corresponding to the SSD capacity into a plurality of logical address range (LBA range) for every block size boundary, and may transmit a color allocation request for designating the plurality of LBA ranges and a plurality of colors to be assigned to the plurality of LBA ranges to the SSD 3. Accordingly, the colors can be easily assigned to every block. For example, it is possible to perform two write operations for two adjacent LBA ranges on two different dies.

(3) SSD Dynamically Selects Color

When the host 2 does not designate the color for the current write operation and does not designate the color in advance, the SSD 3 may dynamically assign the color to the logical address of the writing destination.

That is, the SSD 3 receives the following write command from the host 2.

write (addr=x, data=y)

When the host 2 does not designate the color for addr x in advance, the SSD 3 may give a certain color to addr x. In this case, the SSD 3 determines the writing destination die in which the data designated by the write data is to be written by using the given color and the default policy. In this case, the SSD 3 may select a die in which the best result is acquired for the default policy, and may select a color with which the selected die has the highest priority, as a color to be given.

(4) SSD Implicitly Assigns Color in Advance

The SSD 3 may implicitly assign the colors to all the logical addresses in advance. For example, the SSD 3 may divide the LBA space corresponding to the user area capacity of the SSD 3 into x number of LBAs (referred to as steps), and may periodically assign different colors to the steps. For example, when step is 2 and the number of base colors is 4, the SSD 3 assigns color 0, color 1, color 2, and color 3 to all the logical addresses (LBAs), as shown in FIG. 7.

As stated above, in a case where the SSD 3 implicitly assigns the colors in advance, the default policy may be applied as the policy.

When the host 2 transmits the write command for explicitly designating the color to the SSD 3, the color designated by the write command is applied in preference to the implicitly assigned color.

For example, it is assumed that the host 2 transmits the following write command to the SSD 3 when the color is implicitly assigned to the logical address (LBA) as shown in FIG. 7.

write(addr=2, data=X, color=3, policy=w)

In this case, not color 1 which is an implicit value but color 3 designated by the host 2 is assigned to addr 2.

The host 2 may query about a color currently assigned to the LBA of the SSD 3.

color_query(addr=100)

The SSD 3 notifies the host 2 of a color assigned to the LBA designated by this query.

When the colors are implicitly assigned to all the LBAs, the host 2 may transmit the following query command for querying about setting of implicit color allocation to the SSD 3.

color_implicit_setting_query( )

In response to the reception of the query command, the SSD 3 may transmit the following reply to the host 2.

color_implicit_setting_query_reply(number_of_base_colors=4, step=2)

Figure 8:
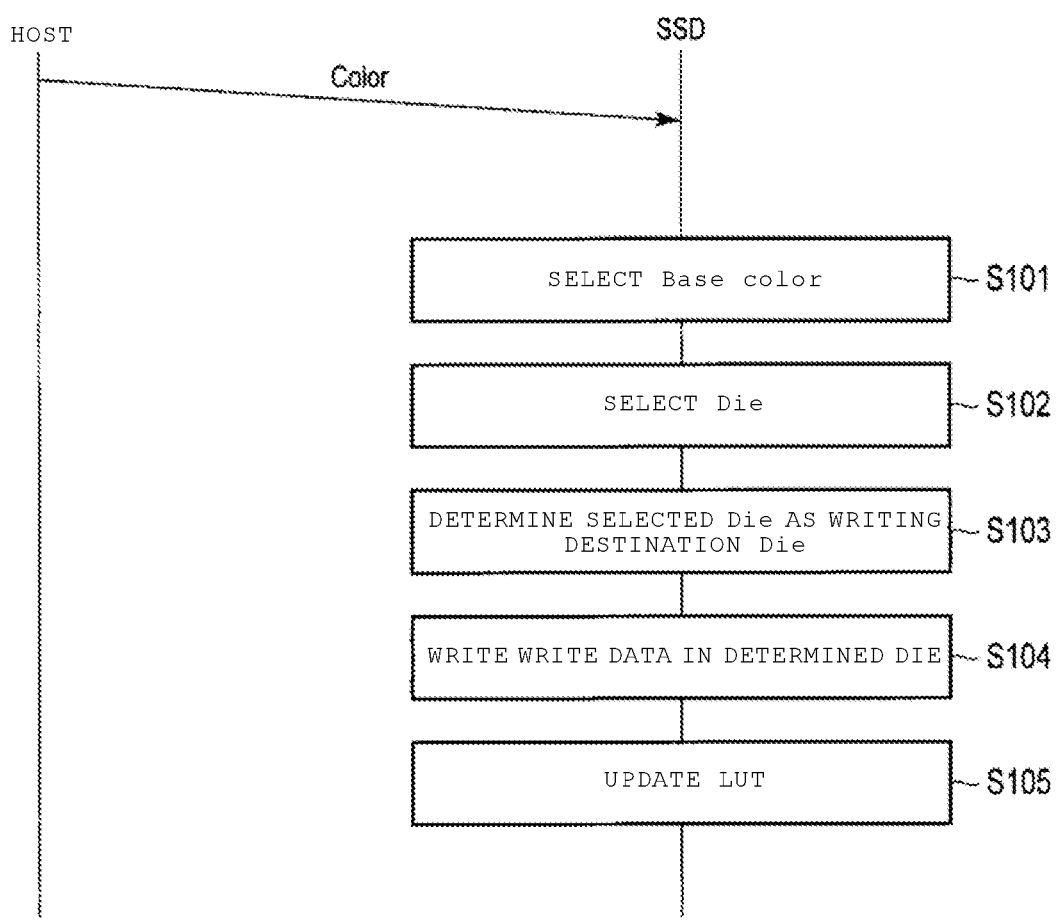
FIG. 8 is a diagram showing a data write process sequence performed by the memory system according to the embodiment.

FIG. 8 shows a data write process sequence performed by the controller 4 of the SSD 3.

In this example, it is assumed that the host 2 designates the color by using the method in which "the host explicitly instructs the color in the writing" or the method in which "the host explicitly instruct the color by designating a range of the logical address (e.g. LBA) in advance".

The controller 4 selects one base color (i.e., one die set) from the plurality of base colors (i.e., the plurality of die sets) based on the color received from the host 2 (step S101). Subsequently, the controller 4 evaluates the states of the dies belonging to the selected die set in descending order of the priority from the die having the highest priority, and selects the die which satisfies the condition related to wear leveling or performance and has a higher priority from the selected die set (step S102). Subsequently, the controller 4 determines the selected die as the writing destination die in which the write data received from the host 2 is to be written (step S103).

The controller 4 writes the write data in the die determined as the writing destination die (step S104). The controller 4 updates the LUT 32, and maps the LBA of the write data to the physical address indicating the storage position of the NAND flash memory 5 in which the write data is written (step S105).

FIG. 9 shows an example of the expanded write command applied to the SSD 3.

The expanded write command includes the following parameters.

(1) Start LBA
(2) Data length (the number of logical blocks)
(3) Color
(4) Policy (option)

The start LBA (start logical address) indicates an initial LBA of the data to be written.

The data length indicates a length (the number of logical blocks corresponding to the data to be written) of the data to be written.

Color is an identifier for designating the writing destination die (in other words, color represents the logical writing destination die). Any integer may be used as the identifier.

Policy is additional information for designating the condition to be preferentially applied in order to select the die, and designates any one of "giving preference to die position", "giving preference to writing speed", and "giving preference to wear leveling".

Figure 10:
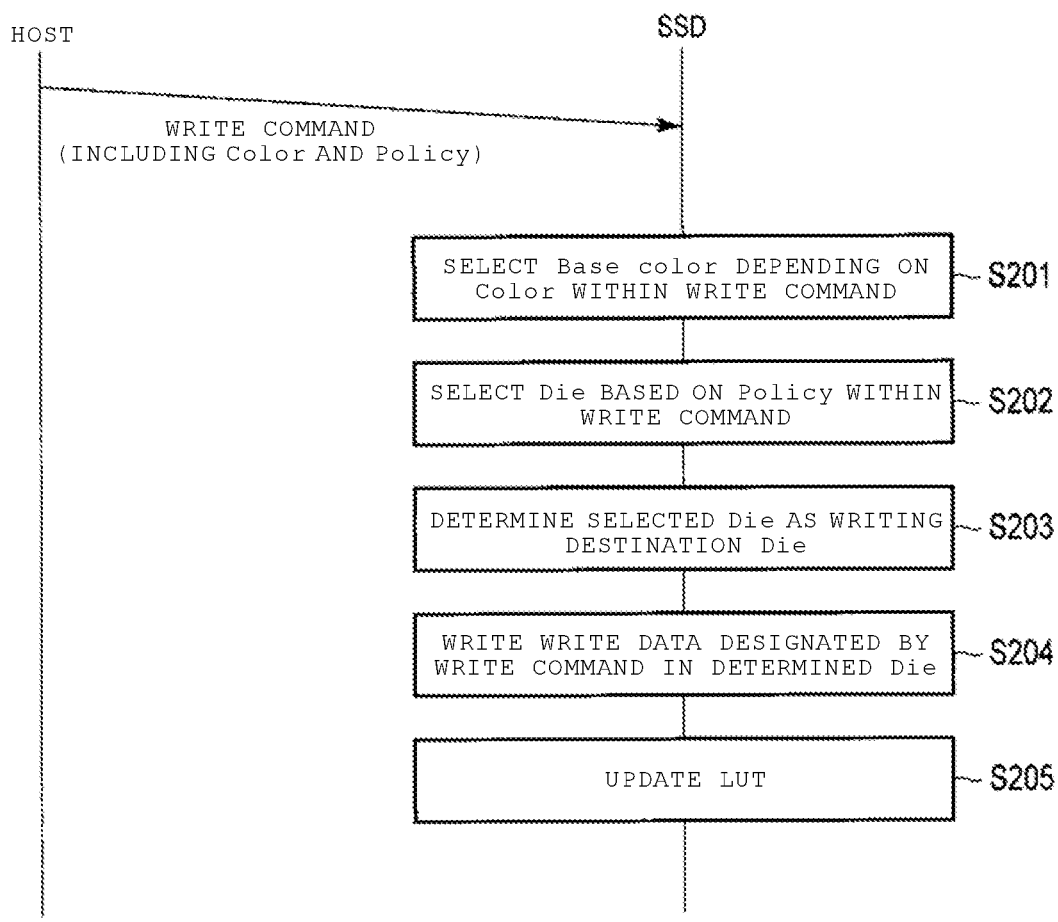
FIG. 10 is a diagram showing a data write process sequence performed by the memory system according to the embodiment in response to the reception of the write command of FIG. 9.

FIG. 10 shows a data write process sequence performed by the controller 4 of the SSD 3.

In this example, it is assumed that the color and the policy are designated by the write command.

The controller 4 selects one base color (i.e., one die set) from the plurality of base colors (i.e., the plurality of die sets) based on the color included in the write command received from the host 2 (step S201). Subsequently, the controller 4 evaluates the states of the dies belonging to the selected die set in descending order of priority from the die having the highest priority, and selects the die which satisfies the condition related to wear leveling or performance and has a higher priority from the selected die set (step S202). Subsequently, the controller 4 determines the selected die as the writing destination die in which the write data received from the host 2 is to be written (step S203).

The controller 4 writes the write data in the die determined as the writing destination die (step S204). The controller 4 updates the LUT 32, and maps the LBA of the write data to the physical address indicating the storage position of the NAND flash memory 5 in which the write data is written (step S205).

FIG. 11 shows an example of a color management command.

The color management command is a command to be used as the color allocation request. The color management command may include a plurality of LBA ranges, a plurality of colors to be assigned to the LBA ranges, and a plurality of policies. That is, the color management command may designate a plurality of combinations, and each combination includes the LBA range, the color, and the policy.

LBA range #1 indicates a certain LBA range (logical address range) to which the same color is to be applied.

The color designated by the color #1 is applied to the LBA range #1. The policy designated by the policy #1 is applied to the LBA range #1.

The LBA range #2 indicates another LBA range (logical address range) to which the same color is to be applied.

The color designated by the color #2 is applied to the LBA range #2, and the policy designated by the policy #2 is applied to the LBA range #2.

Similarly, the color designated by the color #n is applied to the LBA range #n, and the policy designated by the policy #n is applied to the LBA range #n, where n is the maximum number of combinations of the LBA ranges, the colors, and the policies capable of being designated by the color management command.

FIG. 12 shows a color table 33E generated by the controller 4 of the SSD 3 according to the color management command.

Each entry of the color table 33E includes an LBA range field, a color field, and a policy field.

In the entry #1, the LBA range #1 designated by the color management command is registered in the LBA range filed, the color #1 designated by the color management command is registered in the color field, and the policy #1 designated by the color management command is registered in the policy field.

In the entry #2, the LBA range #2 designated by the color management command is registered in the LBA range field, the color #2 designated by the color management command is registered in the color field, and the policy #2 designated by the color management command is registered in the policy field.

Similarly, in the entry #n, the LBA range #n designated by the color management command is registered in the LBA range field, the color #n designated by the color management command is registered in the color field, and the policy #n designated by the color management command is registered in the policy field.

Figure 13:
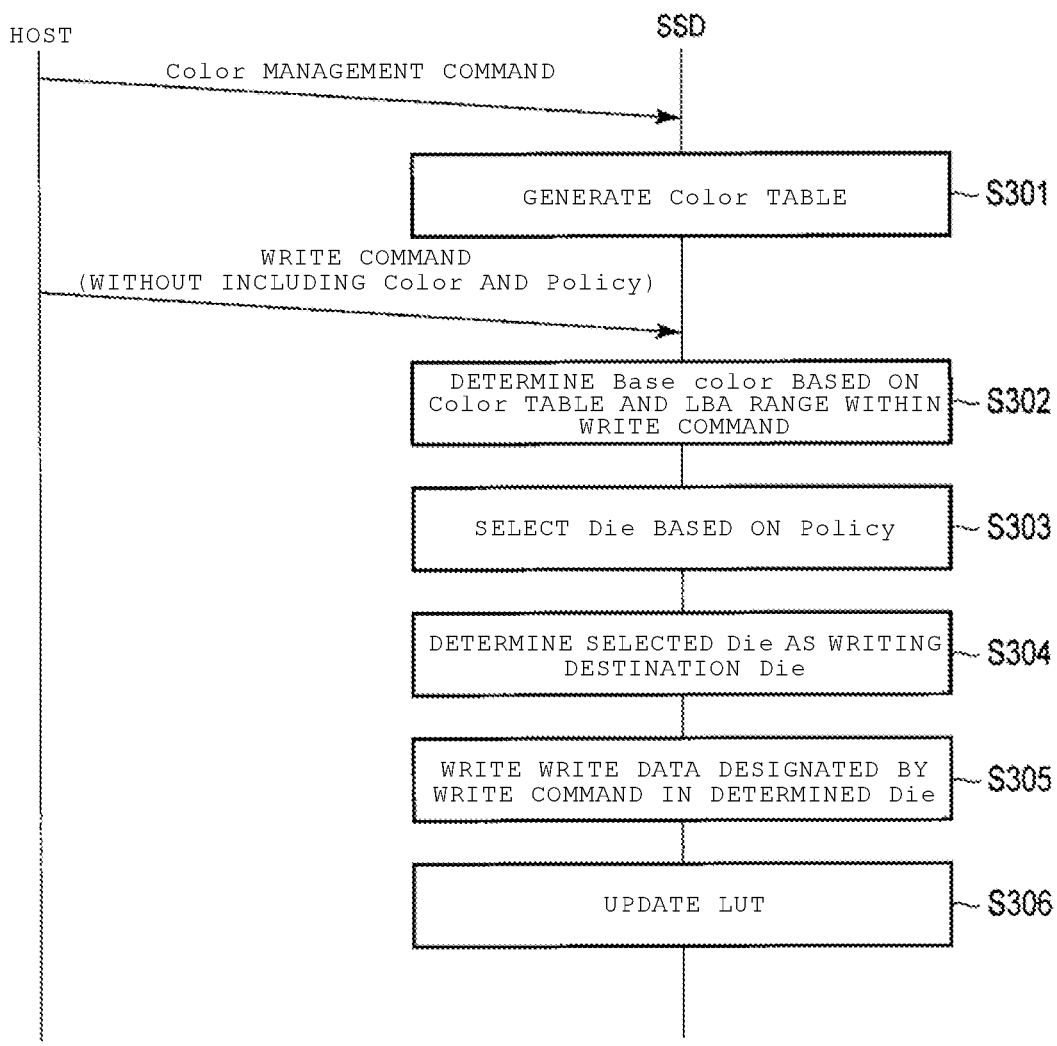
FIG. 13 is a diagram showing a color allocation and data write process sequence performed by the memory system according to the embodiment.

FIG. 13 shows a color allocation and data write process sequence performed by the controller 4 of the SSD 3.

In this example, it is assumed that the host 2 designates the color and the policy in advance by using the color management command and transmits the write command which does not include the color and the policy to the SSD 3.

When the SSD 3 receives the color management command from the host 2, the controller 4 generates the color table 33E (step S301).

Thereafter, when the SSD 3 receives the write command from the host 2, the controller 4 selects one base color (i.e., one die set) based on the color table 33E and the start LBA included in the write command received from the host 2 (step S302). In step S302, the controller 4 specifies the color corresponding to the LBA range to which the start LBA belongs by referring to the color table 33E, and selects one base color (i.e., one die set) based on the specified color.

Subsequently, the controller 4 evaluates the states of the dies belonging to the selected die set in descending order of the priority from the die having the highest priority, and selects the die which satisfies the condition related to wear leveling or performance and has a higher priority from the selected die set (step S303). Subsequently, the controller 4 determines the selected die as the writing destination die in which the write data designated by the received write command is to be written (step S304).

The controller 4 writes the write data in the die determined as the writing destination die (step S305). The controller 4 updates the LUT 32, and maps the LBA of the write data to the physical address indicating the storage position of the NAND flash memory 5 in which the write data is written (step S306).

FIG. 14 shows an example of the priority table 33C when the number of dies is 8 and the number of base colors is 8. The priority table 33C indicates the relationship of the base colors "0" to "7" and eight die sets corresponding to the base colors "0" to "7".

In the priority table 33C, eight different dies #0, #1, #2, #3, #4, #5, #6, and #7 are allocated as the dies having the highest priorities to eight base colors "0", "1", "2", "3", "4", "5", "6", and "7".

The priorities (writing priorities) related to the die set corresponding to the base color "0" are determined in the base color "0" such that the priorities (writing priorities) are lowered in the order of dies #0, #3, #6, #1, #4, #7, #2, and #5.

The priorities (writing priorities) related to the die set corresponding to the base color "1" are determined in the base color "1" such that the priorities (writing priorities) are lowered in the order of dies #1, #4, #7, #2, #5, #0, #3, and #6.

Similarly, the priorities (writing priorities) related to the die set corresponding to the base color "7" are determined in the base color "7" such that the priorities (writing priorities) are lowered in the order of dies #7, #2, #5, #0, #3, #6, #1, and #4.

Specifically, the die set corresponding to the base color "0" includes the die #0, the die #3, the die #6, the die #1, the die #4, the die #7, the die #2, and the die #5. The die #0 in the left end is a die having the highest priority in the die set, and the die #5 in the right end is a die having the lowest priority in the die set. As stated above, the die number is increased by three whenever the priority is lowered by one level.

The die set corresponding to the base color "1" includes the die #1, the die #4, the die #7, the die #2, the die #5, the die #0, the die #3, and the die #6. The die #1 in the left end is a die having the highest priority in the die set, and the die #6 in the right end is a die having the lowest priority in the die set.

The die set corresponding to the base color "2" includes the die #2, the die #5, the die #0, the die #3, the die #6, the die #1, the die #4, and the die #7. The die #2 in the left end is a die having the highest priority in the die set, and the die #7 in the right end is a die having the lowest priority in the die set.

Similarly, in each of the die set corresponding to the base colors "3" to "7", the numbers of the dies are also arranged in the order of the priorities.

Although FIG. 14 shows the priority table 33C in which the number of dies is 8 and the number of base colors is 8, the priority table is not limited thereto. For example, the number of base colors may be less than the number of dies.

FIG. 15 shows an example of the program-erase cycles table 33A.

The program-erase cycles table 33A is used for managing the program-erase cycles of the dies #0 to #7. In this example, a case where the current program-erase cycles of the dies #0, #1, #2, #3, #4, #5, #6, and #7 are 952, 963, 1031, 1012, 1041, 993, 963, and 1017 is illustrated.

FIG. 16 shows an example of the execution queue state table 33D.

The execution queue state table 33D is used for managing the execution queue states of the dies. In this example, the execution queue state indicates the content of the process allocated to each die. In the drawing, "R" represents the read process, "W" represents the write process, and "E" represents the erase process.

In this example, a state in which there is no uncompleted process is represented for the die #0. A state in which one read process is uncompleted is represented for the die #1. A state in which two read processes are uncompleted is represented for the die #2. A state in which one read process and one write process are uncompleted is represented for the die #3. A state in which there is no uncompleted process is represented for the die #4. A state in which one write process is uncompleted is represented for the die #5. A state in which one erase process is uncompleted is represented for the die #6. A state in which one write process and one erase process are uncompleted is represented for the die #7.

FIG. 17 shows an example of a weighting result table.

The controller 4 may calculate a weighting result of the number of remaining uncompleted processes for each die based on the execution queue state of each die. FIG. 17 is the weighting result table when the base color "3" is selected in the priority table 33C of FIG. 14 and the execution queue state of each die is represented in the execution queue state table 33D of FIG. 16. "Weight" represents the weighting result calculated by the controller 4, and "breakdown" represents a calculation procedure of the weighting result.

In this example, there are weighting based on the priority and weighting based on the kind of the process. In the weighting based on the priority, a weight value of 0 is used for the die having the highest priority, and a weight value acquired by increasing the weight value of 0 by three whenever the priority is lowered by one is used. For example, a weight value of 3 is used for the die having the second priority, and a weight value of 6 is used for the die having the third priority. In the weighting based on the kind of the process, a weight value of 1 is used for the read process, a weight value of 10 is used for the write process, and a weight value of 100 is used for the erase process.

When the writing destination die is determined by the policy of "giving preference to writing speed", the controller 4 selects a die having the highest writing speed from the die set of the base color "3" when the base color "3" is selected. When the content of the priority table 33C is as shown in FIG. 14, the controller 4 evaluates the states of the dies in the order of the dies #3, #6, #1, #4, #7, #2, #5, and #0.

That is, the controller 4 initially calculates the weighting result of the number of remaining uncompleted processes of the die #3 having the highest priority in the die set of the base color "3". By referring to FIG. 16, one write process and one read process are included in the uncompleted process of the die #3. The controller 4 uses a weight value based on the priority as 0, a weight value of the write process as 10, and a weight value of the read process as 1, and calculates that the weighting result of the number of remaining uncompleted processes of the die #3 is 11 from the sum of these weight values.

Subsequently, the controller 4 uses a weight value based on the priority as 3 and a weight value of the erase process as 100, and calculates that the weighting result of the number of remaining uncompleted processes of the die #6 having the second priority is 103.

Subsequently, the controller 4 calculates that the weighting result of the number of remaining uncompleted processes of the die #1 having the third priority is "7" by using a weight value based on the priority as "6" and a weight value of the read process as "1".

Subsequently, the controller 4 calculates that the weighting result of the number of remaining uncompleted processes of the die #4 having the fourth priority is "9" by using a weight value based on the priority as "9". Since weights based on the priorities of the dies # having the fifth priority to the subsequent priorities are "12" or more, it can be seen that the weight of the number of remaining uncompleted processes related to the die #1 has the smallest value in this time. Accordingly, the die #1 is selected as the die having the highest writing speed.

Figure 18:
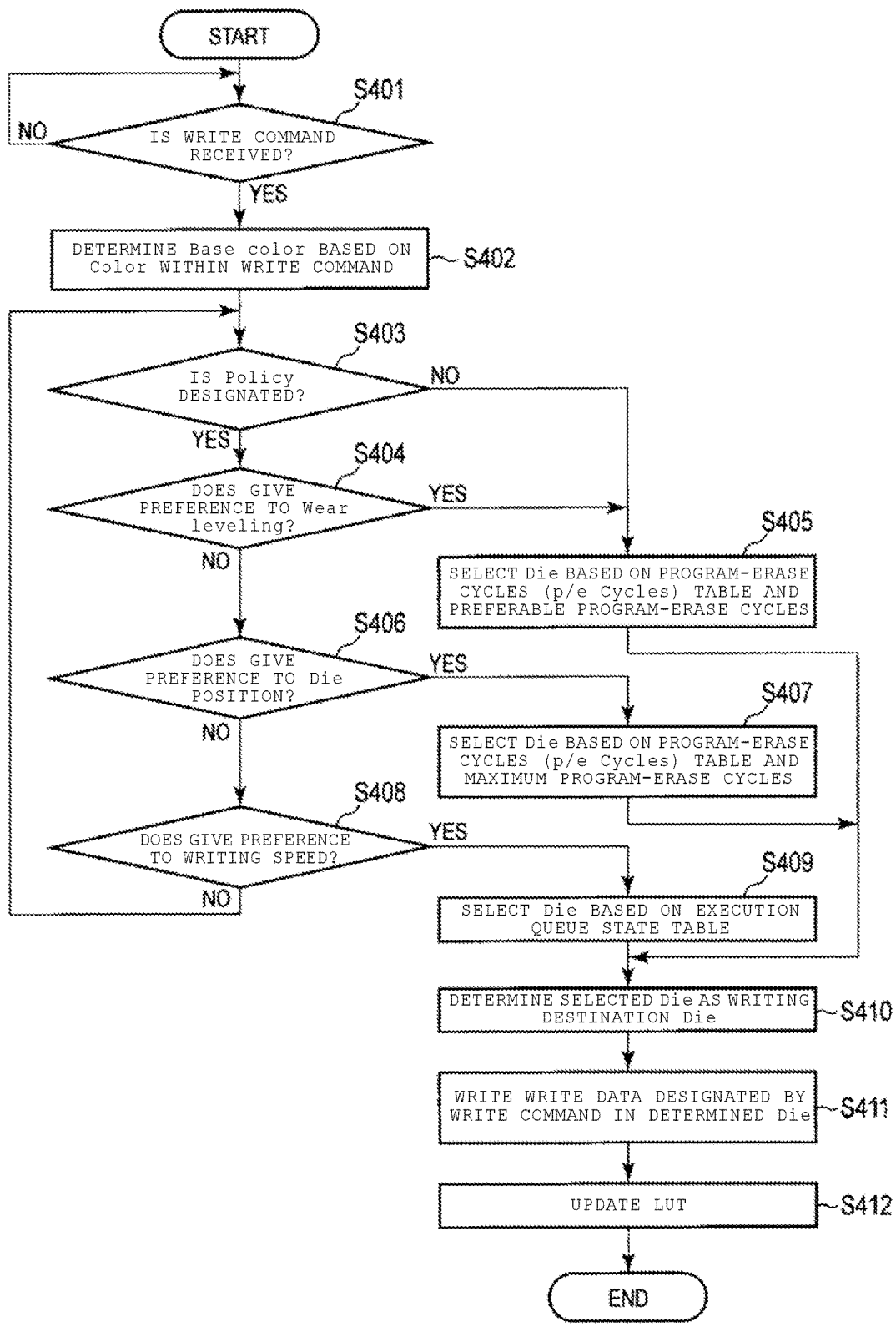
FIG. 18 is a diagram showing a procedure of a write operation performed by the memory system according to the embodiment.

A flowchart of FIG. 18 shows a procedure of the write operation performed by the SSD 3 when the host 2 designates the color.

In the following description, it is assumed that the priority table 33C is defined as shown in FIG. 14, the content of the program-erase cycles table 33A is as shown in FIG. 15, and the content of the execution queue state table 33D is as shown in FIG. 15.

When the SSD 3 receives the write command from the host 2 (YES of step S401), the controller 4 selects the base color based on the color designated by the write command (step S402).

For example, when the color "1051" is designated by the write command, the controller 4 selects "3" as the base color. This is because the remainder acquired by dividing the color "1051" by 8, which is the number of base colors of the SSD 3, is "3". In the following description, "3" is selected as the base color.

Subsequently, the controller 4 determines whether or not the policy is designated by the write command (step S403).

If the policy is designated by the write command (YES of step S403), the controller 4 performs the following processes.

When the policy designated by the write command is "giving preference to wear leveling" (YES of step S404), the controller 4 selects the die from the die set of the base color "3" based on the program-erase cycles table 33A and preferable program-erase cycles (step S405).

In this example, for example, it is assumed that the condition of the wear leveling is as follows.

(1) A maximum allowable difference from minimum program-erase cycles is 100.

(2) A preferable allowable difference is 30.

The controller 4 determines that the minimum program-erase cycles are 952 from the program-erase cycles table 33A of FIG. 15. Accordingly, preferable program-erase cycles are 982 (=952+30), and maximum allowable program-erase cycles are 1052 (=952+100).

The controller 4 compares the program-erase cycles with the preferable program-erase cycles (982 cycles) in descending order of priority from the die having the highest priority in the die set of the base color "3". In the example of the present description, the program-erase cycles (1012 cycles) of the dies #3 having the highest priority exceed the preferable program-erase cycles (982 cycles). The program-erase cycles of the die #6 (963 cycles) having the second priority are equal to or less than the preferable program-erase cycles (982 cycles). Thus, the controller 4 selects the die #6 and does not compare the program-erase cycles of the dies having the third priority and the subsequent priorities with the preferable program-erase cycles.

When the policy designated by the write command is "giving preference to die position" (YES of step S404), the controller 4 selects the die in consideration of the program-erase cycles of the dies within the selected die set (step S407).

The controller 4 compares the program-erase cycles with the maximum allowable program-erase cycles in descending order of priority from the die having the highest priority in the die set of the base color "3". In this example of the present description, since the maximum allowable program-erase cycles are derived from the wear leveling condition, the maximum allowable program-erase cycles are 1052.

In the example of the present description, since the program-erase cycles of the die #3 (1012) having the highest priority are equal to or less than the maximum allowable program-erase cycles (1052), the controller 4 selects the die #3.

When the policy designated by the write command is "giving preference to writing speed" (YES of step S408), the controller 4 selects the die based on the execution queue state table 33D (step S409).

When the execution queue state table 33D is as shown in FIG. 16, the controller 4 calculates the weighting result of the number of remaining uncompleted processes of the die in descending order of priority from the die having the highest priority in the die set of the base color "3". The weighting result is as represented in the weighting result table shown in FIG. 17. A small weighting result means that a reply speed to the received write command is fast. According to the weighting result table shown in FIG. 17, the die of which the calculated weighting result is minimum is the die #1. Thus, the controller 4 selects the die #1.

Subsequently, a case where the policy is not designated by the write command is described (NO of step S403).

In this case, the controller 4 may select the die by using the same method as that when "giving preference to wear leveling" is designated by the policy (step S405). Although it is described in FIG. 18 that the controller selects the die according to the policy of "giving preference to wear leveling" when the policy is not designated, the method for selecting the die is not limited thereto. When the policy is not designated, the controller may select the die according to the policy of "giving preference to die position" or "giving preference to writing speed".

Subsequently, the controller 4 determines the selected die as the writing destination die (step S410), and writes the write data designated by the write command in the determined die (step S411). Thereafter, the controller 4 updates the LUT 32, and maps the LBA of the write data to the physical address indicating the storage position of the NAND flash memory 5 in which the write data is written (step S412).

Hereinafter, the write operation performed by the SSD 3 in response to the reception of the color management command will be described.

Figure 19:
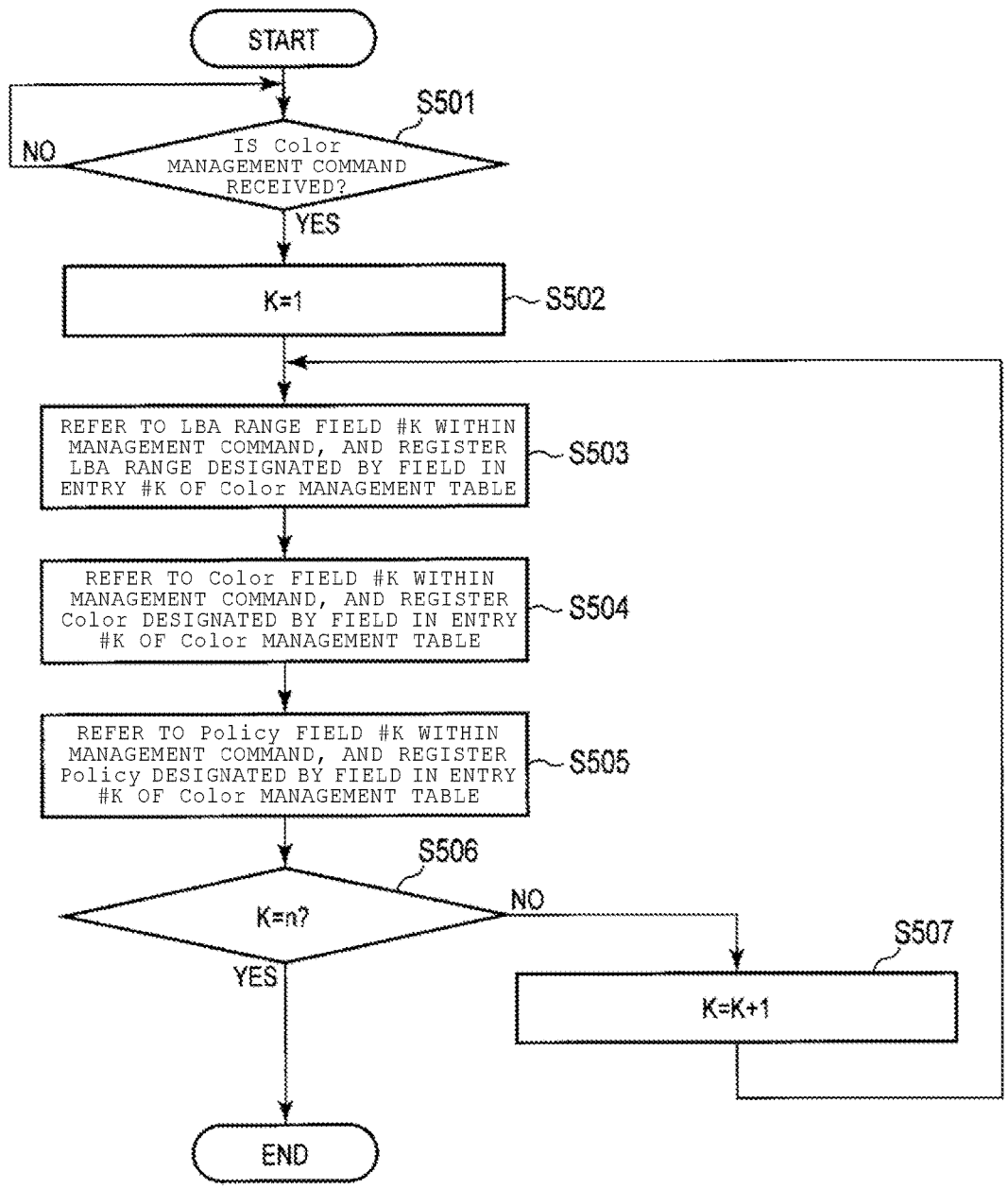
FIG. 19 is a flowchart showing a procedure of color table generation processes performed by the memory system according to the embodiment in accordance with the color management command of FIG. 11.

A flowchart of FIG. 19 shows a procedure of the write operation performed by the SSD 3 when the color management command is received from the host 2.

When the SSD 3 receives the color management command from the host 2 (YES of step S501), the controller 4 generates the color table 33E according to the following procedure.

Initially, the controller 4 substitutes variable K for "1" (step S502), and registers LBA range #K of the color management command in the LBA range field of entry #K of the color table 33E (step S503). A range of K is 1≤K≤n, where n is the maximum number of combinations of the LBA ranges, the colors, and the policies capable of being designated by the color management command.

Subsequently, the controller 4 registers color #K of the color management command in the color field of the entry #K of the color table 33E (step S504).

Subsequently, the controller 4 registers policy #K of the color management command in the policy field of the entry #K of the color table 33E (step S505). When the policy is not designated in the color management command, the policy field of the color table 33E is empty.

When the process of step S505 is ended, all the fields of the entry #K of the color table 33E are in the registered state.

Subsequently, the controller 4 checks whether or not current variable K is n. When K is not n (NO of step S506), the controller substitutes K for "K+1" (step S507), and the processes of steps S503 to S505 are performed. The processes of steps S503 to S507 are performed until all the LBA ranges, the colors, and the policies of the color management command are registered in the color table 33E.

The controller 4 repeats the processes of steps S503 to S507. When it is checked that K=n (YES of step S506), the process of generating the color table 33E is ended. As stated above, the controller 4 generates the color table 33E.

Figure 20:
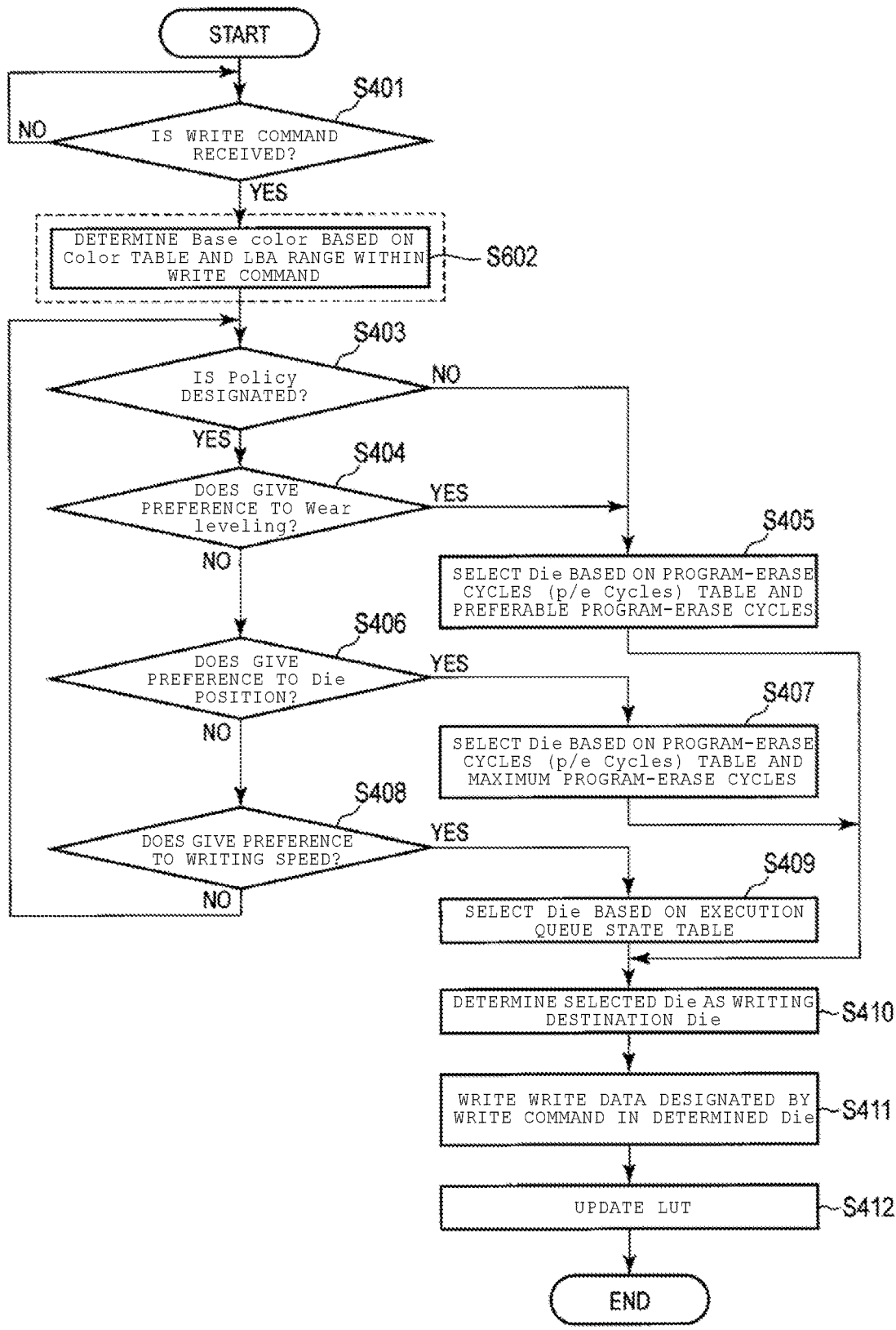
FIG. 20 is a diagram showing a procedure of a write operation performed by the memory system according to the embodiment in accordance with a typical write command received after the color table is generated.

A flowchart of FIG. 20 shows a procedure of the write operation performed by the SSD 3 when a normal write command is received after the process of the color management command from the host is completed. In this example, the processes of step S401, and steps S403 to S412 are the same processes as those of FIG. 18.

It is assumed that a process for generating the color table 33E shown in FIG. 19 is already performed as a preprocess of the write operation shown in FIG. 20.

When the SSD 3 receives the write command from the host 2 (YES of step S401), the controller 4 determines the base color based on the color table 33E and the start LBA included in the write command (step S602). In step S602, the controller 4 determines the LBA range registered in the already generated color table 33E to which the start LBA included in the write command belongs. For example, when the start LBA belongs to the LBA range #1, the controller 4 selects the base color based on the color #1 corresponding to the LBA range #1. For example, if the color #1 indicates an integer "1051", the controller 4 selects "3" as the base color. Similarly to the operation of FIG. 18, this is because the remainder acquired by dividing "1051" by 8, which is the number of base colors, is "3".

The controller 4 selects the base color, and performs the processes of steps S403 to S412 described in FIG. 18.

Figure 21:
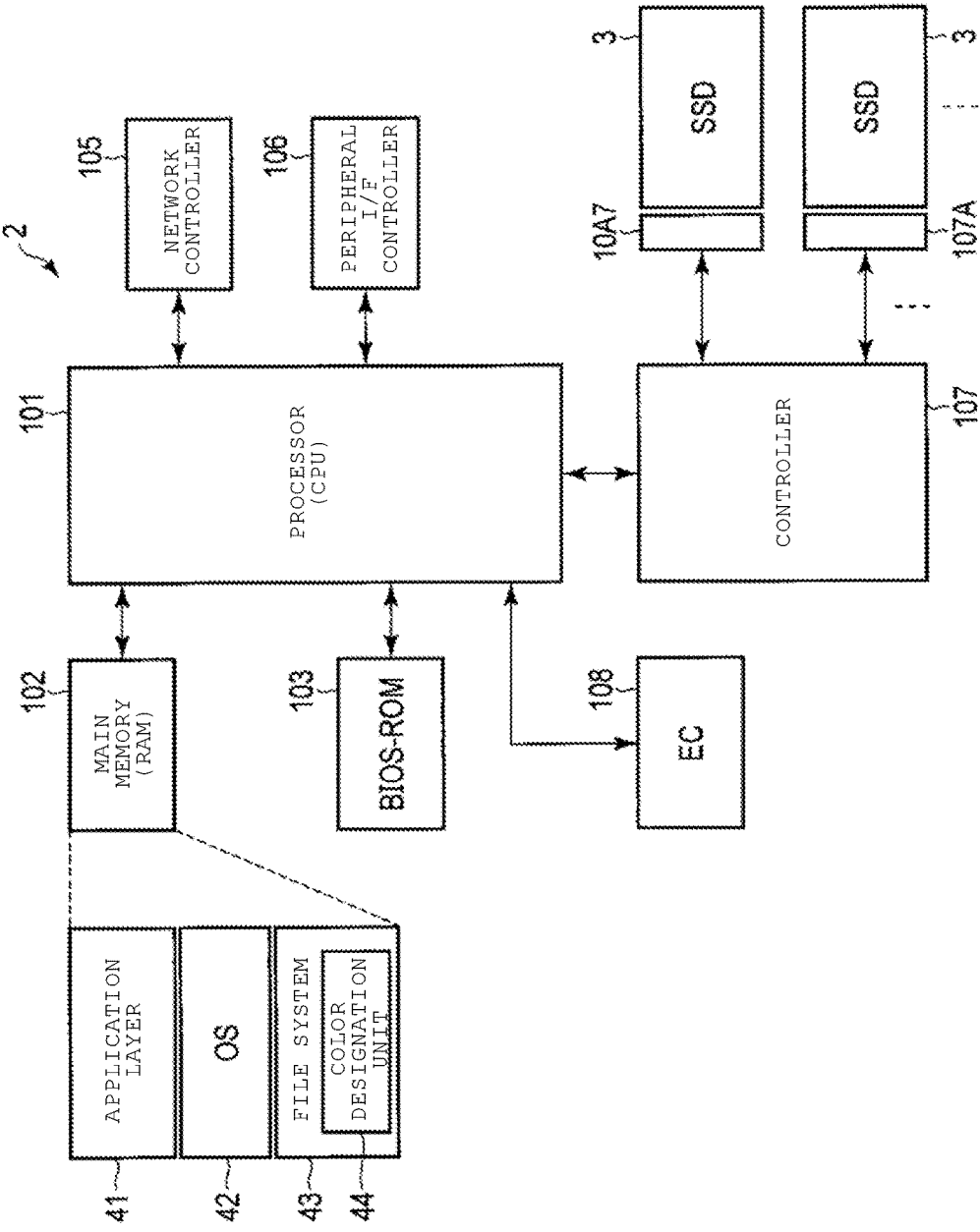
FIG. 21 is a block diagram showing a configuration example of the host.

FIG. 21 shows an example of a hardware configuration of the information processing device functioning as the host 2.

The information processing device is realized as a computing device such as a server (for example, storage server). The information processing device includes a processor (CPU) 101, a main memory 102, a BIOS-ROM 103, a network controller 105, a peripheral interface controller 106, a controller 107, and an embedded controller (EC) 108.

The processor 101 is a CPU configured to control operations of components of the information processing device. The processor 101 executes various programs loaded to the main memory 102 from any one of the plurality of SSDs 3. The main memory 102 is a random-access memory such as a DRAM. The program executed by the processor 101 includes the application software layer 41, the OS 42, the file system. 43, and the color designation unit 44.

The processor 101 executes a basic input and output system (BIOS) stored in the BIOS-ROM 103 which is a non-volatile memory. BIOS is a system program for hardware control.

The network controller 105 is a communication device such as a wired LAN controller or a wireless LAN controller. The peripheral interface controller 106 is configured to perform communication with a peripheral device such as a USB device.

The controller 107 is configured to perform communication with devices connected to a plurality of connectors 107A. In the present embodiment, the plurality of SSDs 3 is connected to the plurality of connectors 107A, respectively. The controller 107 is a SAS expander, a PCIe switch, a PCIe expander, a flash array controller, or a RAID controller.

The EC 108 functions as a system controller configured to perform power management of the information processing device. The EC 108 turns on and turns off the information processing device in response to an operation of the power switch by the user. The EC 108 is realized as a processing circuit such as a one-chip microcontroller. The EC 108 may include a keyboard controller that controls an input device such as a keyboard (KB).

FIG. 22 shows a configuration example of the information processing device (computing device) including the plurality of SSDs 3 and the host 2.

The information processing device includes a thin box-shaped casing 201 capable of being accommodated in a rack. The plurality of SSDs 3 may be arranged within the casing 201. In this case, each SSD 3 may be detachably inserted into a slot provided in a front surface 201A of the casing 201.

A system board (e.g., motherboard) 202 is disposed within the casing 201. Various electronic components including the CPU 101, the memory 102, the network controller 105, and the controller 107 are mounted on the system board 202. These electronic components function as the host 2.

As described above, according to the embodiment, the plurality of non-volatile memory dies is managed as a plurality of die sets each including the plurality of non-volatile memory dies to which the priorities are given. One die set is selected from the plurality of die sets based on the color (i.e., the identifier for designating the logical writing destination die) received from the host 2. The non-volatile memory die is selected from the selected die set based on the prioritization of the dies within the selected die set, and the selected non-volatile memory die is determined as the writing destination die in which the write data received from the host 2 is to be written.

Thus, it is possible to gradually distribute the die to be used as the writing destination die across the dies within the selected die set with the elapse of time. As a result, even when the host 2 performs the writing biased to the specific color, it is possible to distribute the writing between the dies within the die set corresponding to the color, and it is possible to maintain the lifespan of the SSD 3.

Different die sets are selected when different colors are designated. Thus, as long as the host 2 performs the writing which is not biased to the specific color, it is possible to decrease a probability that the die collision will occur.

Thus, it is possible to improve the performance of the SSD 3 without shortening the lifespan of the SSD 3.

Although it is described in the present embodiment that the number of base colors and the number of colors capable of being designated by the host 2 are different from each other, the number of colors capable of being designated by the host 2 may be the same as the number of base colors. In this case, for example, the controller 4 of the SSD 3 may notify the host 2 of the number of base colors according to a request from the host 2. Accordingly, the host 2 can set the number of colors capable of being designated to be the same as the number of base colors.

In the present embodiment, the NAND memory is used as the example of the non-volatile memory. However, the function of the present embodiment may be applied to other various non-volatile memories such as a magnetoresistive random-access memory (MRAM), a phase change random access memory (PRAM), a resistive random access memory (ReRAM), and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system capable of being connected to a host, the memory system comprising:
a non-volatile memory that includes a plurality of non-volatile memory dies; and
a controller that is electrically connected to the non-volatile memory,
wherein the controller is configured to
manage the plurality of non-volatile memory dies as a plurality of die sets, each die set including two or more of the non-volatile memory dies to which priorities are assigned respectively,
select one die set from the plurality of die sets based on an identifier received from the host, and
select, based on the assigned priorities, a non-volatile memory die from the selected die set as a writing destination die of write data received from the host.

2. The memory system according to claim 1,
wherein the controller is configured to select the non-volatile memory die further based on program-erase cycles of the non-volatile memory dies included in the selected die set.

3. The memory system according to claim 1,
wherein the controller is configured to select the non-volatile memory die further based on the number of uncompleted processes to be executed therein.

4. The memory system according to claim 3,
wherein the controller selects, as the writing destination die, a first non-volatile memory die having no uncompleted process to be executed therein over a second non-volatile memory die having an uncompleted process to be executed therein even though the second non-volatile memory die has a higher assigned priority than the first non-volatile memory die.

5. The memory system according to claim 1,
wherein non-volatile memory dies having a highest assigned priority in the plurality of die sets are different across the plurality of die sets.

6. The memory system according to claim 1,
wherein the identifier is received from the host in connection with a write command, and the controller is configured to select the non-volatile memory die so that a difference between program-erase cycles of the selected non-volatile memory die and minimum program-erase cycles of the plurality of non-volatile memory dies within the selected die set is within an allowable difference, and which has a highest assigned priority among the non-volatile memory dies within the selected die set having the difference within the allowable difference, when the received write command includes a policy indicating that wear leveling is to be preferentially considered.

7. The memory system according to claim 1,
wherein the identifier is received from the host in connection with a write command, and the controller is configured to select the non-volatile memory die based on the number of uncompleted processes to be executed therein in order of the assigned priorities of the non-volatile memory dies within the selected die set, when the received write command includes a policy indicating that a writing speed is to be preferentially considered.

8. A memory system capable of being connected to a host, the memory system comprising:
a non-volatile memory that includes a plurality of non-volatile memory dies; and
a controller that is electrically connected to the non-volatile memory, wherein the controller is configured to
responsive to a first command from the host,
assign a plurality of logical address ranges to a plurality of identifiers, respectively, and
responsive to a second command from the host,
determine a logical address range, among the plurality of logical address ranges, to which a start logical address designated by the second command belongs,
select one die set from a plurality of die sets based on the identifier corresponding to the logical address range to which the start logical address belongs,
select, based on the assigned priorities, a non-volatile memory die from the selected die set as a writing destination die, and
write data designated by the second command in the selected writing destination die.

9. The memory system according to claim 8, wherein
the first command further designates policies to be respectively applied to the plurality of logical address ranges, and
the controller is configured to select the non-volatile memory die so that a difference between program-erase cycles of the selected non-volatile memory die and minimum program-erase cycles of the plurality of non-volatile memory dies within the selected die set is within an allowable difference, and which has a highest assigned priority among the non-volatile memory dies within the selected die set having the difference within the allowable difference, when a policy to be applied to the logical address range to which the start logical address belongs indicates that wear leveling is to be preferentially considered.

10. The memory system according to claim 8, wherein
the first command further designates policies to be respectively applied to the plurality of logical address ranges, and
the controller is configured to select the non-volatile memory die based on the number of uncompleted processes to be executed therein in order of the assigned priorities of the non-volatile memory dies within the selected die set, when a policy to be applied to the logical address range to which the start logical address belongs includes a policy indicating that a writing speed is to be preferentially considered.

11. A method of controlling a write operation on non-volatile memory that includes a plurality of non-volatile memory dies, said method comprising:
managing the plurality of non-volatile memory dies as a plurality of die sets, each die set including two or more of the non-volatile memory dies to which priorities are assigned respectively; and
responsive to a write command received from a host,
selecting one die set from the plurality of die sets based on an identifier associated with the write command, and
selecting, based on the assigned priorities, a non-volatile memory die from the selected die set as a writing destination die of write data received from the host.

12. The method according to claim 11, wherein the identifier is received from the host in connection with the write command.

13. The method according to claim 12, wherein the non-volatile memory die is selected based on program-erase cycles of the non-volatile memory dies included in the selected die set and assigned priorities thereof within the selected die set.

14. The method according to claim 12, wherein the non-volatile memory die is selected based on the number and type of uncompleted processes to be executed therein.

15. The method according to claim 14, wherein a first non-volatile memory die having no uncompleted process to be executed therein is selected over a second non-volatile memory die having an uncompleted process to be executed therein even though the second non-volatile memory die has a higher assigned priority than the first non-volatile memory die.

16. The method according to claim 14, wherein an uncompleted read process is considered to be completed faster than an uncompleted write process, and the uncompleted write process is considered to be completed faster than an uncompleted erase process.

17. The method according to claim 11,
wherein non-volatile memory dies having a highest assigned priority in the plurality of die sets are different across the plurality of die sets.

18. The method according to claim 11, further comprising:
responsive to a management command from the host, assigning a plurality of logical address ranges to a plurality of identifiers, respectively,
wherein the identifier is determined based on a start logical address specified in the write command and assigned thereto responsive to the management command.

19. The method according to claim 18, wherein
the management command further designates policies to be respectively applied to the plurality of logical address ranges, and
when a policy to be applied to a logical address range to which the start logical address belongs indicates that wear leveling is to be preferentially considered, a non-volatile memory die is selected as the writing destination die so that a difference between program-erase cycles of the selected non-volatile memory die and minimum program-erase cycles of the plurality of non-volatile memory dies within the selected die set is within an allowable difference, and which has a highest assigned priority among the non-volatile memory dies within the selected die set having the difference within the allowable difference.

20. The method according to claim 18, wherein
the management command further designates policies to be respectively applied to the plurality of logical address ranges, and
when a policy to be applied to a logical address range to which the start logical address belongs includes a policy indicating that a writing speed is to be preferentially considered, a non-volatile memory die is selected based on the number of uncompleted processes to be executed therein in order of the assigned priorities of the non-volatile memory dies within the selected die set.

* * * * *